(12) United States Patent
Kishino et al.

(10) Patent No.: US 9,516,746 B2
(45) Date of Patent: Dec. 6, 2016

(54) METAL-CLAD LAMINATE AND PRINTED WIRING BOARD

(71) Applicant: PANASONIC CORPORATION, Osaka (JP)

(72) Inventors: Koji Kishino, Fukushima (JP); Hiroharu Inoue, Osaka (JP); Takeshi Kitamura, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 106 days.

(21) Appl. No.: 14/359,909

(22) PCT Filed: Nov. 21, 2012

(86) PCT No.: PCT/JP2012/007462
§ 371 (c)(1),
(2) Date: May 21, 2014

(87) PCT Pub. No.: WO2013/076973
PCT Pub. Date: May 30, 2013

(65) Prior Publication Data
US 2014/0311781 A1    Oct. 23, 2014

(30) Foreign Application Priority Data

Nov. 22, 2011    (JP) .................................. 2011-254966

(51) Int. Cl.
*H05K 1/03*    (2006.01)
*H05K 1/02*    (2006.01)
(Continued)

(52) U.S. Cl.
CPC ............. *H05K 1/0298* (2013.01); *B32B 5/022* (2013.01); *B32B 15/08* (2013.01); *B32B 15/14* (2013.01);
(Continued)

(58) Field of Classification Search
USPC .......................................................... 174/258
See application file for complete search history.

(56) References Cited

U.S. PATENT DOCUMENTS 3,527,665 A * 9/1970 Wright ................. H05K 1/0326
156/327
3,955,024 A * 5/1976 Goldman ................ C08L 63/00
174/255
(Continued)

FOREIGN PATENT DOCUMENTS

CN    1942310 A    4/2007
CN    101683004 A    3/2010
(Continued)

OTHER PUBLICATIONS

Taiwanese Office Action issued in Taiwanese Application No. 101143758 dated Jul. 28, 2014, w/Partial English translation.
(Continued)

*Primary Examiner* — Michael F McAllister
(74) *Attorney, Agent, or Firm* — McDermott Will & Emery LLP

(57) ABSTRACT

A metal-clad laminate of the present invention includes an insulating layer and a metal layer disposed on at least one surface of the insulating layer. The insulating layer is formed by laminating at least a center layer and surface resin layers disposed on both surfaces of the center layer. The center layer contains a heat-curable resin and includes a core layer containing at least one fibrous base material and a heat-curable resin layer that does not contain a fibrous base material. The ratio of the thickness of the surface resin layer to the thickness of the heat-curable resin layer is between 0.5 and 10.

5 Claims, 1 Drawing Sheet

(51) Int. Cl.
*B32B 5/02* (2006.01)
*B32B 15/08* (2006.01)
*B32B 15/14* (2006.01)
*B32B 27/08* (2006.01)
*B32B 27/12* (2006.01)
*B32B 27/20* (2006.01)
*B32B 17/04* (2006.01)
*H05K 3/00* (2006.01)
*H05K 3/02* (2006.01)

(52) U.S. Cl.
CPC ............... *B32B 17/04* (2013.01); *B32B 27/08* (2013.01); *B32B 27/12* (2013.01); *B32B 27/20* (2013.01); *H05K 1/036* (2013.01); *B32B 2260/021* (2013.01); *B32B 2260/046* (2013.01); *B32B 2262/0269* (2013.01); *B32B 2262/0276* (2013.01); *B32B 2262/10* (2013.01); *B32B 2262/101* (2013.01); *B32B 2307/54* (2013.01); *B32B 2457/08* (2013.01); *H05K 1/0366* (2013.01); *H05K 3/022* (2013.01); *H05K 2201/0195* (2013.01); *H05K 2201/029* (2013.01); *Y10T 428/2495* (2015.01)

(56) References Cited

U.S. PATENT DOCUMENTS

| | | | | |
|---|---|---|---|---|
| 4,902,556 | A * | 2/1990 | Benedikt | B32B 3/12 216/20 |
| 6,417,459 | B1 * | 7/2002 | Kanzaki | D03D 15/0011 174/250 |
| 7,045,198 | B2 * | 5/2006 | Nakagiri | B32B 5/26 257/750 |
| 7,056,571 | B2 * | 6/2006 | Tomekawa | B32B 15/04 174/250 |
| 8,115,105 | B2 * | 2/2012 | Amou | B32B 17/02 174/250 |
| 2003/0203174 | A1 * | 10/2003 | McCarthy | H05K 1/034 428/209 |
| 2009/0244865 | A1 | 10/2009 | Tanaka | |
| 2013/0319735 | A1 | 12/2013 | Inoue et al. | |

FOREIGN PATENT DOCUMENTS

| | | | |
|---|---|---|---|
| JP | 58-94458 | A | 6/1983 |
| JP | 61-5909 | A | 1/1986 |
| JP | 61-137736 | A | 6/1986 |
| JP | 61-173933 | A | 8/1986 |
| JP | 05-124148 | A | 5/1993 |
| JP | 06-344503 | A | 12/1994 |
| JP | 08-216340 | A | 8/1996 |
| JP | 08-244165 | A | 9/1996 |
| JP | 2001-269954 | A | 10/2001 |
| JP | 2003-340952 | A | 12/2003 |
| JP | 2005-288966 | A | 10/2004 |
| JP | 2005-288966 | * | 10/2005 |
| JP | 2005-288966 | A | 10/2005 |
| JP | 2011-235583 | A | 11/2011 |
| WO | 2012/114680 | A1 | 8/2012 |

OTHER PUBLICATIONS

Chinese Office Action and Search Report issued in Chinese Application No. 201280057040.9 dated Feb. 5, 2015, with English Translation of Search Report.

International Search Report issued in International Application No. PCT/JP2012/007462 with Date of mailing Mar. 5, 2013, with English Translation.

* cited by examiner

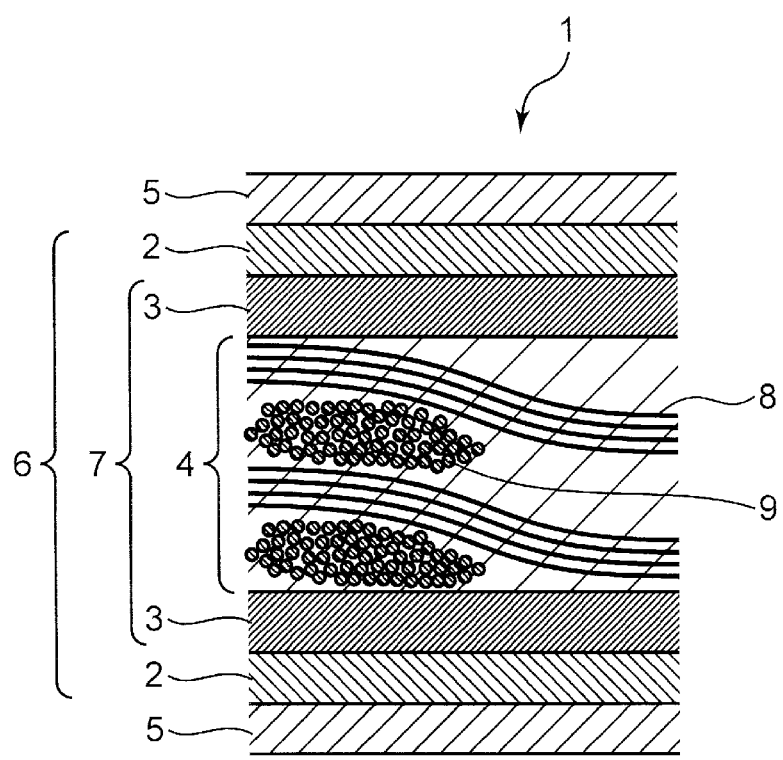

METAL-CLAD LAMINATE AND PRINTED WIRING BOARD

RELATED APPLICATIONS

This application is a national phase application of the U.S. National Phase under 35 U.S.C. §371 of International Application No. PCT/JP2012/007462, filed on Nov. 21, 2012, which in turn claims the benefit of Japanese Application No. 2011-254966, filed on Nov. 22, 2011, the disclosures of which Applications are incorporated by reference herein.

TECHNICAL FIELD

The present invention relates to a metal-clad laminate and a printed wiring board obtained by using the metal-clad laminate.

BACKGROUND ART

With a decrease in the size and the thickness of electronic devices, a surface-mounted package is often used as electronic components provided in the electronic device. A specific example of such an electronic component package includes a semiconductor package in which an electronic component such as a semiconductor element is mounted on a surface of a substrate such as a board-on-chip (BOC) and the electronic component is sealed by a resin.

In general, for a copper-clad laminate for semiconductor packages, a reduced warpage is required in a substrate (copper-clad laminate) because an IC chip is mounted thereon. However, in particular, in a sealing step after an IC chip is mounted on an electronic circuit substrate obtained by processing the copper-clad laminate, since the substrate is bonded to a sealing material having a relatively large thermal shrinkage, a deformation such as a warpage may occur due to a difference in the coefficient of thermal expansion (CTE) between the sealing resin and the substrate. This warpage may cause a problem such as a line clogging in a subsequent reflow step or a misalignment of the cutting positions in a cutting step where the substrate is cut to a product size.

In order to suppress such a warpage (curl), conventionally, the use of a laminate formed by laminating a plurality of semi-cured prepregs obtained by impregnating a thin glass cloth with a resin varnish and drying the same and heating and pressing the prepregs is known.

More specifically, for example, Patent Document 1 discloses a method of manufacturing a metal foil-clad laminate, including impregnating a sheet-like base material with a heat-curable resin and drying the same to obtain a prepreg, placing a metal foil on a surface of the prepreg layer, and heating and pressing the prepreg layer to form the metal foil-clad laminate, the method including: applying a first resin composition including an acrylic rubber, an epoxy resin, a phenol resin, and an inorganic filler to a roughened surface of the metal foil; applying a second resin composition of which the adhesive property disappears in a dried state and of which the elastic modulus is higher than the first resin composition to the application surface and drying the same; and superimposing the application surface on the prepreg layer and performing the heating and pressing to form a low elastic resin layer formed from a first resin composition having a thickness of at least 20 μm and an elastic modulus of not more than 10 kgf/mm² immediately below the metal foil.

According to Patent Document 1, it is disclosed that the metal foil-clad laminate obtained by laminating a plurality of prepregs and pressing the same is ideally used as a surface-mounted printed wiring board material and that solder connection reliability of surface-mounted low-thermal expansion components can be ensured even if the components are subjected to repeated cooling/heating cycles. That is, in Patent Document 1, a low elastic resin layer is disposed under the metal foil in order to reduce the stress applied to a solder connection portion.

The metal-clad laminate obtained by the method disclosed in Patent Document 1 is an approximately 1.6-mm thick composite-type copper-clad laminate in which a plurality of prepregs is superimposed. However, with a decrease in the thickness of metal foil-clad laminates in recent years, the method disclosed in Patent Document 1 was unable to sufficiently suppress a package warpage on account of a gap occurring when mold-sealing the semiconductor package with a sealing material after mounting semiconductors on a semiconductor package that uses a thin metal-clad laminate as a substrate.

Patent Document 1: Japanese Patent Application Publication No. H8-244165

SUMMARY OF THE INVENTION

In view of the foregoing, it is an object of the present invention to provide a metal-clad laminate and a printed wiring board having higher reliability.

The present inventors have conducted a comprehensive study to solve the problems and have found that the problems can be solved by the following means.

A metal-clad laminate according to an aspect of the present invention includes an insulating layer and a metal layer disposed on at least one surface of the insulating layer, wherein the insulating layer is formed by laminating at least a center layer and surface resin layers disposed on both surfaces of the center layer, the center layer contains a heat-curable resin and includes a core layer containing at least one fibrous base material and a heat-curable resin layer that does not contain a fibrous base material, and the ratio of the thickness of the surface resin layer to the thickness of the heat-curable resin layer is between 0.5 and 10.

A printed wiring board according to another aspect of the present invention is obtained by partially removing the metal layer of the metal-clad laminate to form a circuit.

The above and other objects, features, aspects, and advantages of the present invention will become more apparent from the following detailed descriptions and the accompanying drawings.

BRIEF DESCRIPTION OF THE DRAWING

FIG. 1 is a schematic cross-sectional view illustrating an example of a metal-clad laminate according to the present embodiment.

DESCRIPTION OF EMBODIMENTS

Embodiments of the present invention will be described hereinafter, yet the present invention is not limited to these embodiments.

A metal-clad laminate according to the present embodiment includes an insulating layer and a metal layer disposed on at least one surface of the insulating layer, wherein the insulating layer is formed by laminating at least a center layer and surface resin layers disposed on both surfaces of the center layer, the center layer contains a heat-curable resin and includes a core layer containing at least one fibrous base material and a heat-curable resin layer that does not contain a fibrous base material, and the ratio of the thickness of the surface resin layer to the thickness of the heat-curable resin layer is between 0.5 and 10.

With such a configuration, it is possible to obtain a metal-clad laminate in which occurrence of a warpage is further prevented and which serves as an extremely reliable substrate. By using the obtained metal-clad laminate as a substrate, it is possible to reduce a warpage of a semiconductor package that is bonded to a sealing material.

More specifically, according to the configuration, the resin layer can be formed uniformly and in a sufficient thickness on the front and rear surfaces of the fibrous base material that is present in the center layer. Thus, it is thought that a thermal shrinkage necessary for the semiconductor package substrate (metal-clad laminate) during mold-sealing of a sealing material can be increased while maintaining a high elastic modulus and a low warpage necessary for the semiconductor package substrate and the warpage of the semiconductor package after sealing can be reduced.

Moreover, it is thought that, when the ratio of the thickness of the surface resin layer to the thickness of the heat-curable resin layer exceeds 0.5, the thickness of the surface resin layer can be secured, a thermal shrinkage increases, and the warpage of the semiconductor package after sealing is suppressed. It is also thought that, when the ratio is equal to or smaller than 10, the uniform thickness of the metal-clad laminate can be obtained with no excessive increase in the thickness of the surface resin layer, and the warpage of the semiconductor package after sealing can be suppressed.

The other configurations of the metal-clad laminate according to the present embodiment are not particularly limited as long as the laminate satisfies the configuration described above. A metal-clad laminate having such a layer structure as illustrated in FIG. 1 can be a specific example of the metal-clad laminate. FIG. 1 is a schematic cross-sectional view illustrating an example of a metal-clad laminate 1 according to the present embodiment.

Moreover, as illustrated in FIG. 1, the metal-clad laminate 1 according to the present embodiment includes an insulating layer 6 and a metal layer 5 disposed on a surface of the insulating layer 6, in which the insulating layer 6 is formed by laminating three layers of a center layer 7 and two surface resin layers 2 disposed on both surfaces of the center layer 7. Further, the center layer 7 includes a core layer 4 and heat-curable resin layers 3 disposed on both surfaces of the core layer 4.

The core layer 4 contains a fibrous base material and the fibrous base material is a fiber-like base member that generally includes weft threads 8 and warp threads 9.

Moreover, the insulating layer 6 may only need to include the center layer 7 (the heat-curable resin layer 3 and the core layer 4) and the surface resin layer 2 and may further include another layer. Specifically, an intermediate layer for enhancing the adhesive property of the metal layer 5 and the insulating layer 6 may be provided on the surface of the surface resin layer 2 or the heat-curable resin layer 3 (that is, between the surface resin layer 2 and the metal layer 5). Moreover, another layer (for example, such an intermediate layer as described above) may be provided between the surface resin layer 2 and the center layer 7.

Hereinafter, respective layers that form the metal-clad laminate according to the present embodiment will be described.

As described above, the insulating layer of the present embodiment is not particularly limited as long as the layer is formed by laminating at least three layers of the center layer and two surface resin layers disposed on both surfaces of the center layer.

Moreover, the thickness of the insulating layer is not particularly limited but is preferably between approximately 30 μm and 250 μm. If the insulating layer is too thin, a printed wiring board formed by partially removing the metal layer becomes too thin, and the mechanical strength or the like tends to be insufficient. On the other hand, if the insulating layer is too thick, it tends to be difficult to manufacture the metal-clad laminate. Further, if the insulating layer is too thick, the metal-clad laminate also becomes thick, which makes it difficult to reduce the size and thickness of a substrate obtained from the metal-clad laminate and finally obtained electronic components.

The thickness of the center layer, the surface resin layer, the heat-curable resin layer, the insulating layer, and the metal-clad laminate can be measured by observing the cross-section of the metal-clad laminate using a microscope.

Moreover, the center layer of the insulating layer contains a heat-curable resin and includes a core layer containing at least one fibrous base material and a heat-curable resin layer that does not contain a fibrous base material, and the ratio of the thickness of the surface resin layer to the thickness of the heat-curable resin layer is between 0.5 and 10.

The center layer of the embodiment is not particularly limited as long as the center layer satisfies the configuration described above.

Specifically, the center layer (the core layer and the heat-curable resin layer) is not particularly limited as long as the center layer contains a cured product of a resin composition, the resin composition contains a heat-curable resin, the core layer contains a fibrous base material, and the ratio of the thickness of a surface resin layer described later to the thickness of the heat-curable resin layer is in the abovementioned range.

In the present embodiment, the heat-curable resin layer indicates a region of the center layer which is disposed on both surfaces of the core layer that contains the fibrous base material and which does not contain the fibrous base material. In general, no interface is present between the core layer and the heat-curable resin layer. Moreover, the thickness is a value obtained by measuring the distance to a linear dark portion (interface) observed in the interface between the surface resin layer and the heat-curable resin layer from the surface of the fibrous base material in the outermost layer in the cross-section observation using a microscope.

The thickness of the heat-curable resin layer is not particularly limited as long as the ratio of the thickness of the surface resin layer described later to the heat-curable resin layer is between 0.5 and 10, and for example, the thickness is between 1 μm and 15 μm and preferably between 3 μm and 10 μm.

The core layer of the center layer contains a cured product of the heat-curable resin composition and contains the fibrous base material as described above. That is, the core layer is a layer obtained by impregnating a fibrous base material with a heat-curable resin composition and curing the heat-curable resin composition.

The fibrous base material used in the core layer of the present embodiment is not particularly limited, and for example, a sheet-like fibrous base material including weft threads and warp threads can be used. Moreover, specific examples of the fibrous base material include woven fabrics of inorganic fiber such as glass cloth, nonwoven fabrics of inorganic fiber, aramid cloth, polyester cloth, paper, and the like. Moreover, the thickness of the fibrous base material is not particularly limited, and for example, the thickness is preferably between approximately 5 μm and 150 μm.

The fibrous base material contained in the core layer is not particularly limited as long as at least one fibrous base material is contained, but in order to minimize the thickness of the metal-clad laminate, preferably two fibrous base materials or fewer are contained, and more preferably, one fibrous base material is contained. A sheet in which one set of weft threads and warp threads are combined is counted as one fibrous base material. For example, referring to FIG. 1, the core layer of FIG. 1 contains two fibrous base materials.

As described above, the center layer contains the heat-curable resin and is a layer that includes a core layer that contains at least one fibrous base material and a heat-curable resin layer that does not contain a fibrous base material. Thus, the core layer and the heat-curable resin layer are preferably formed as an integrated material (that is, the center layer), and the same heat-curable resin composition is generally used as the heat-curable resin composition of the core layer and the heat-curable resin layer.

The thickness of the center layer is not particularly limited, and for example, the thickness is between 10 μm and 160 μm and preferably between 20 μm and 140 μm.

Moreover, the resin composition contained in the center layer is not particularly limited as long as the resin composition contains a heat-curable resin, and the elastic modulus of the cured product thereof is preferably between approximately 3 Gpa and 10 Gpa and more preferably between 5 Gpa and 8 Gpa at 25° C. If the elastic modulus of the cured product of the resin composition contained in the center layer is too low, a problem such as a line clogging when the metal foil-clad laminate is conveyed may occur. On the other hand, if the elastic modulus of the cured product of the resin composition contained in the center layer is too high, a drilling property and a punching property may deteriorate.

Examples of the resin composition usable in the center layer include an epoxy compound, an epoxy resin composition that contains a curing agent, and the like.

Such an epoxy compound is not particularly limited, and examples thereof include epoxy compounds that have two or more epoxy groups in one molecule. More specifically, specific examples thereof include bisphenol-type epoxy resins, novolac-type epoxy resins, phenol novolac-type epoxy resins, alicyclic epoxy resins, heterocyclic epoxy resins, and the like. These materials may be used singly or in combinations of two or more types.

The curing agent used is not particularly limited. Specifically, the curing agent is capable of curing an epoxy compound, and examples thereof include imidazole-based curing agents, and the like.

The resin composition of the center layer preferably contains a radical polymerizable heat-curable compound. By doing so, it is possible to provide a metal-clad laminate having higher reliability. This is considered to be due primarily to the following reasons.

First, it is thought that, when the radical polymerizable heat-curable compound is contained as a resin composition of the center layer, the resin composition of the center layer can be ideally cured and that an ideal center layer can be formed. Moreover, it is thought that, when the center layer contains a fibrous base material such as glass cloth, the center layer is obtained by impregnating the fibrous base material with a resin composition and curing the resin composition. In this case, it is thought that, when the radical polymerizable heat-curable compound is contained as the resin composition of the center layer, as the resin composition exhibits favorable impregnation into the fibrous base material, a more ideal core layer can be formed. From these reasons, it is thought that a metal-clad laminate having higher reliability can be provided. Further, it is thought that the resin composition of the center layer can be ideally cured on account of the inclusion of the radical polymerizable heat-curable compound, and continuous production of the metal-clad laminate is made easier.

Such a radical polymerizable heat-curable compound is not particularly limited. Examples of the radical polymerizable heat-curable compound include radical polymerizable heat-curable monomers, radical polymerizable heat-curable resins, and the like.

Examples of radical polymerizable heat-curable monomers include monomers having at least one radical polymerizable unsaturated group in one molecule. Specific examples thereof include styrene, methyl styrene, halogenated styrene, (meth)acrylic acid, methyl methacrylate, ethyl methacrylate, butyl acrylate, divinyl benzene, ethylene glycol di(meth)acrylate, propylene glycol di(meth)acrylate, trimethylolpropane tri(meth)acrylate, pentaerythritol tri(meth)acrylate, pentaerythritol tetra(meth)acrylate, or the like. These materials may be used singly or in combinations of two or more types.

Examples of radical polymerizable heat-curable resins include resins having at least two radical-polymerizable unsaturated groups in one molecule. Specific examples include vinyl ester resins, which are reaction products of an epoxy resin and an unsaturated fatty acid such as acrylic acid or methacrylic acid; unsaturated polyesters, which are reaction products of propylene glycol, bisphenol A-propylene oxide adducts, or the like with a polybasic unsaturated acid such as maleic anhydride or fumaric acid; or bisphenol A-type methacrylates. These materials may be used singly or in combinations of two or more types.

When such radical polymerizable heat-curable compounds are used, the resin composition preferably contains a radical polymerization agent. Specific examples of radical polymerization initiators include organic peroxides such as ketone peroxides, for example methyl ethyl ketone peroxide, methyl isobutyl ketone peroxide, cyclohexanone peroxide, or the like; diacyl peroxides such as benzoyl peroxide, isobutyl peroxide, or the like; hydroperoxides such as cumene hydroperoxide, t-butyl hydroperoxide, or the like; dialkyl peroxides such as dicumyl peroxide, di-t-butyl peroxide, or the like; peroxyketals such as 1,1-di-t-butylperoxy-3,3,5-trimethylcyclohexanone, 2,2-di-(t-butylperoxy)butane, or the like; alkyl peresters such as t-butylperbenzoate, t-butyl peroxy-2-ethylhexanoate, or the like; and percarbonates such as bis(4-t-butylcyclohexyl)peroxydicarbonate, t-butylperoxyisobutyl carbonate, or the like, and inorganic peroxides such as hydrogen peroxide, or the like. These materials may be used singly or in combinations of two or more types.

The resin composition of the center layer may further contain an elastomer, an inorganic filler, and the like.

The elastomer is not particularly limited, and examples thereof include low-volatile liquid rubber such as liquid polybutadiene or liquid NBR; and crosslinked or non-crosslinked rubber particles of NBR rubber, SBR rubber, acrylic rubber, silicone rubber or the like.

The inorganic filler is not particularly limited, and examples thereof include spherical silica, alumina, and the like. Further, the content of the inorganic filler is preferably such that the elastic modulus of the cured product of the resin composition contained in the center layer satisfies the relationship described above.

The resin composition of the center layer is preferably a liquid resin composition. That is, the epoxy compound and the radical polymerizable heat-curable compound contained in the resin composition are preferably liquids. When these compounds are liquids, it is possible to provide a metal-clad laminate having higher reliability. This is considered to be due primarily to the following reasons.

First, it is thought that, since a liquid resin composition is used as the resin composition of the center layer, an ideal center layer having a smooth surface can be formed. Moreover, it is thought that, when the center layer contains a fibrous base material such as glass cloth, the center layer is a layer obtained by impregnating the fibrous base material with a resin composition and curing the impregnated resin composition. In this case, it is found that, when the liquid resin composition is used as the resin composition of the center layer, the ability of the resin composition to impregnate into the fibrous base material is excellent and a more ideal center layer can be formed. From these reasons, it is thought that a metal-clad laminate having higher reliability can be provided. Further, it is thought that, when the liquid resin composition is used as the resin composition of the center layer, continuous production of the metal-clad laminate is made easier.

Moreover, the resin composition of the center layer is preferably a resin composition that contains no solvent (that is, a solvent-free resin composition). By doing so, it is possible to continuously produce the metal-clad laminate.

Next, the surface resin layer of the insulating layer will be described. The surface resin layer in the present embodiment is not particularly limited as long as the surface resin layer satisfies the configuration described above. Specifically, the surface resin layer is not particularly limited as long as the surface resin layer contains a cured product of the resin composition and the ratio of the thickness of the surface resin layer to the thickness of the heat-curable resin layer is between 0.5 and 10. It is thought that, when the surface resin layer is disposed on the surface of the heat-curable resin layer in such a thickness ratio, it is possible to form a surface resin layer having a sufficient thickness for suppressing a warpage on both surfaces of the fibrous base material of the core layer and to obtain a highly reliable metal-clad laminate. The thickness ratio of the surface resin layer to the thickness of the heat-curable resin layer is preferably between 0.5 and 5 and more preferably between 1 and 4.

The thickness of the surface resin layer is not particularly limited as long as the ratio to the thickness of the heat-curable resin layer described above is between 0.5 and 10. For example, the thickness of the surface resin layer is between 3 μm and 60 μm and preferably between 5 μm and 40 μm.

The surface resin layer according to the present embodiment does not contain a fibrous base material, and the surface resin layer consists of a cured product of the resin composition.

The resin composition contained in the surface resin layer is not particularly limited as long as the resin composition is heat-curable, and the elastic modulus of the cured product is preferably between 3 Gpa and 20 Gpa and more preferably between 5 Gpa and 15 Gpa at 25° C. If the elastic modulus of the cured product of the resin composition contained in the surface resin layer is too low, a problem such as a line clogging when the metal foil-clad laminate is conveyed may occur. On the other hand, if the elastic modulus of the cured product of the resin composition contained in the surface resin layer is too high, a drilling property and a punching property may deteriorate.

The surface resin layer may be a layer of the same composition as or of a different composition from the resin composition contained in the center layer (the core layer and the heat-curable resin layer) as long as the surface resin layer satisfies the thickness ratio described above.

Further, the ratio of the thickness of the surface resin layer to the thickness of the entire metal-clad laminate (that is, the insulating layer (i.e. the center layer and the surface resin layer)) excluding the metal layer is preferably between 0.02 and 0.5 and more preferably between 0.05 and 0.2. When the surface resin layer has such a thickness ratio, it is possible to reduce a warpage of the substrate and the semiconductor package more reliably.

The resin composition usable in such a surface resin layer is not particularly limited, and specific examples thereof include an epoxy compound, an epoxy resin composition that contains a curing agent, and the like.

Preferably, a resin composition having a coefficient of thermal expansion of 50 ppm/° C. or higher is used for the surface resin layer. Since it is thought that the difference in the thermal shrinkage between the substrate and the sealing material can be reduced when the resin composition having a coefficient of thermal expansion of 50 ppm/° C. or higher is used, it is possible to obtain an extremely reliable metal-clad laminate in which a warpage occurs rarely. Although there is no particular upper limit of the coefficient of thermal expansion as long as it is 50 ppm/° C. or higher, the coefficient of thermal expansion is preferably 100 ppm/° C. or lower from the perspective of maintaining a high elastic modulus required for the metal-clad laminate.

The coefficient of thermal expansion can be calculated by measuring the amount of expansion during heating according to thermomechanical analysis (TMA).

The coefficient of thermal expansion can be adjusted by appropriately preparing the compositions of the resin composition, and for example, the coefficient of thermal expansion of the resin composition can be increased by decreasing the amount of the inorganic filler mixed therein.

The epoxy compound contained in the resin composition that forms the surface resin layer is not particularly limited. For example, an epoxy compound having two or more epoxy groups in one molecule may be ideally used. More specifically, specific examples thereof include cresol novolac-type epoxy resins, bisphenol F-type epoxy resins, phenol novolac-type epoxy resins, dicyclopentadiene-type epoxy resins, biphenyl-type epoxy resins, naphthalene-type epoxy resin, bisphenol A-type epoxy resins and phenol aralkyl-type epoxy resins. These materials may be used singly or in combinations of two or more types.

The curing agent is not particularly limited as long as the curing agent can cure the epoxy compound. Specific examples thereof include phosphorus-modified phenolic resins and the like. The phosphorus-modified phenolic resin is not particularly limited. Specific examples thereof include resins in which a phosphorus compound such as 9,10-dihydro-9-oxa-10-phosphaphenanthrene-10-oxide is bonded to an aliphatic carbon or the like of a phenolic resin. Moreover, a commercially available product can be used as the curing agent. Specific examples thereof include commercialized products such as EXB9000 (product of DIC Corporation), EXB9005 (product of DIC Corporation), and the like.

The resin composition of the surface resin layer may contain an inorganic filler or the like. The inorganic filler is not particularly limited, and examples thereof include spherical silica, alumina, and the like. The content of the inorganic filler is preferably selected such that the coefficient of thermal expansion of the resin composition is 50 ppm/° C. or higher.

Next, the metal layer of the metal-clad laminate will be described. The metal layer is not particularly limited, and specific examples thereof include metal foil and the like that can be used as a metal layer of metal-clad laminates. Moreover, examples of the metal foil include copper foil such as electrolytic copper foil. The thickness of the metal foil is not particularly limited, and for example, is preferably between 2 μm and 35 μm. Moreover, specific examples of the metal layer include an electrolytic copper foil (12-μm thick 3EC-VLP; product of Mitsui Mining & Smelting Corporation).

The metal-clad laminate may be a metal-clad laminate in which the metal layer is disposed on one surface of the insulating layer, or a metal-clad laminate in which the metal layer is disposed on both surfaces of the insulating layer, but is preferably a metal-clad laminate in which the metal layer is disposed on both surfaces of the insulating layer. If so, it is possible to form a substrate having metal wirings formed on both surfaces by partially removing the metal layer on the surface. Moreover, a metal-clad laminate in which metal wirings can be formed on both surfaces can provide high reliability. Further, highly reliable electronic components can be obtained by manufacturing electronic components using such a metal-clad laminate.

A method of manufacturing the metal-clad laminate is not particularly limited as long as a metal-clad laminate having the configuration described above can be manufactured. Specifically, the following method can be used, for example.

First, the fibrous base material is impregnated with the resin composition of the center layer. Impregnation can be achieved, for example, through dipping, coating, or the like. By doing so, prepregs for forming the center layer that includes the core layer and the heat-curable resin layer can be obtained.

The metal foil that becomes the metal layer is coated with the resin composition of the surface resin layer. The metal foil coated with the resin composition is stacked in such a manner that the resin composition comes into contact with one of the surfaces of the prepregs for forming the center layer. Moreover, similarly, the metal foil that becomes the metal layer is coated with the resin composition of the surface resin layer. The metal foil coated with the resin composition is stacked in such a manner that the resin composition comes into contact with the other surface of the prepregs for forming the center layer.

Subsequently, the laminate including the prepregs is dried and heated. By doing so, the resin compositions contained in the respective layers are thermally cured, and a metal-clad laminate is obtained.

Although a method in which the metal foil is first coated with the resin composition that forms the surface resin layer has been described, the method is not limited to this, and for example, the metal foil may be stacked after the prepregs for forming the center layer is first coated with the resin composition.

Moreover, the obtained metal-clad laminate can be used as a printed wiring board by forming a circuit by etching the metal layer, for example. That is, when a circuit is formed by etching the metal layer of the obtained metal-clad laminate, for example, it is possible to obtain a printed wiring board in which a conductor pattern is formed as a circuit on the surface of the laminate. The printed wiring board thus obtained provides high reliability.

The present specification discloses techniques of various aspects as described above, and major techniques are described below.

A metal-clad laminate according to an aspect of the present embodiment includes an insulating layer and a metal layer disposed on at least one surface of the insulating layer, wherein the insulating layer is formed by laminating at least a center layer and surface resin layers disposed on both surfaces of the center layer, the center layer contains a heat-curable resin and includes a core layer containing at least one fibrous base material and a heat-curable resin layer that does not contain a fibrous base material, and the ratio of the thickness of the surface resin layer to the thickness of the heat-curable resin layer is between 0.5 and 10.

With such a configuration, it is possible to obtain a metal-clad laminate in which a warpage occurs rarely and which becomes an extremely reliable substrate. By using the obtained metal-clad laminate as a substrate, it is possible to reduce a warpage of a semiconductor package that is bonded to a sealing material.

Moreover, a ratio of the thickness of the surface resin layer to the thickness of the entire metal-clad laminate excluding the metal layer is preferably between 0.02 and 0.5. Due to this, it is possible to obtain a metal-clad laminate having higher reliability.

Further, the surface resin layer preferably consists of a resin composition having a coefficient of thermal expansion of 50 ppm/° C. or higher. It is thought that, when such a resin composition is used, the difference in the thermal shrinkage between the sealing material and the substrate decreases further, and the warpage of the semiconductor package can be decreased more.

Moreover, in the metal-clad laminate, the metal layer is preferably disposed on both surfaces of the insulating layer. According to such a configuration, it is possible to form a substrate in which metal wirings are formed on both surfaces by partially removing the metal layer on the surface. Moreover, the metal-clad laminate in which metal wirings can be formed on both surfaces can provide high reliability. Moreover, it is possible to obtain highly reliable electronic components by manufacturing electronic components using such a metal-clad laminate.

Further, a printed wiring board according to another aspect of the present invention is obtained by partially removing the metal layer of the metal-clad laminate to form a circuit.

According to such a configuration, it is possible to provide a highly reliable printed wiring board.

The present invention is explained more specifically below based on examples, but the invention is not limited to these examples.

EXAMPLES

Example 1

First, a resin composition including the following materials was prepared as the resin composition of the center layer:

(A) styrene monomer (product of Nippon Steel Chemical Corporation): 15 parts by mass;

(B) epoxy resin "EPICLON" (product of Dainippon Ink & Chemicals Corporation): 34 parts by mass;

(C) cumene hydroperoxide (CHP) "Percumyl H-80" (Product of Nippon Oil & Fats Corporation): 0.5 parts by mass, as organic peroxides;

(D) 2-ethyl-4-methylimidazole (2E4MZ) (product of Shikoku Chemicals Corporation): 0.5 parts by mass, as epoxy resin curing accelerator; and (E) aluminum hydroxide CL303 (product of Sumitomo Chemical Corporation): 20 parts by mass and spherical silica ($SiO_2$) SO25R (product of Admatechs Corporation): 30 parts by mass, as inorganic filler.

Then the respective materials were measured and put into a container and were mixed to prepare a resin varnish. The resin varnish was prepared by dissolving the styrene monomer and the epoxy resin to form a liquid resin component, adding the organic peroxides (C), the imidazole-based curing accelerator (D), and the inorganic filler (E), and dispersing the inorganic filler (E) using a bead mill.

Further, a resin composition including the following materials was prepared as the resin composition of the surface resin layer.

(A) epoxy resin EPPN502H (product of Nippon Kayaku Corporation): 10 parts by mass;

(B) phenol curing agent TD-2090 (product of DIC Corporation): 10 parts by mass;

(D) 2-ethyl-4-methylimidazole (2E4MZ) (product of Shikoku Chemicals Corporation): 0.05 parts by mass, as epoxy resin curing accelerator; and (E) aluminum hydroxide "CL30" (product of Sumitomo Chemical Corporation): 40 parts by mass and spherical silica ($SiO_2$) "SO25R" (product of Admatechs Corporation): 40 parts by mass, as inorganic filler.

Then, the respective materials were measured and put into a container and methyl ethyl ketone (solvent) was added and mixed therein so that a solid content becomes 70 mass %, whereby a resin varnish was prepared.

Subsequently, a copper foil (JTC; product of Nikko Metal Corporation) was uniformly coated with the resin varnish of the resin composition of the surface resin layer and was dried for three minutes at 170° C. to prepare two sheets of copper foil having a 40-μm thick surface resin layer.

The coefficient of thermal expansion of the resin composition of the surface resin layer obtained in this manner was 30 ppm/° C. when the resin compositions peeled from the copper foil were collected and heated and cured for 60 minutes at 170° C. to obtain a 0.8-mm thick planar resin board and the coefficient of thermal expansion of the resin board was measured using a thermomechanical analysis apparatus (TMA).

Two sheets of glass cloth (IPC 1078 type, plain weave, 43 μm thick) were stacked on the surface resin layer of the copper foil that was coated with the surface resin layer and dried, and was impregnated with the resin varnish of the resin composition of the center layer. The copper foil coated with the surface resin layer and dried was disposed on the upper surface in the same manner, and the same was put into an oven so that the resin component was cured in such a curing condition that the resin component was cured for 10 minutes at 105° C. followed by curing for 15 minutes at 200° C., whereby a copper-clad laminate was obtained.

The thicknesses of the core layer, the heat-curable resin layer, and the surface resin layer of the obtained metal-clad laminate, and the metal-clad laminate (excluding the metal layer) were 100 μm, 10 μm, 40 μm, and 200 μm, respectively. These thicknesses were measured by observing the cross-section of the obtained metal-clad laminate using a microscope. In particular, the thickness of the heat-curable resin layer was measured by measuring the distance to a linear dark portion observed in the interface between the surface resin layer and the heat-curable resin layer from the surface of the fibrous base material in the outermost layer.

Example 2

A metal-clad laminate was obtained in the same manner as Example 1 except that two sheets of copper foil having a 20-μm surface resin layer and two sheets of glass cloth (IPC 1280 type, plain weave, 56 μm thick) were used and the amounts of coating resin compositions were adjusted so that the thicknesses of the core layer, the heat-curable resin layer, and the surface resin layer were 140 μm, 10 μm, and 20 μm, respectively. The thickness of the metal-clad laminate (excluding the metal layer) was 200 μm.

Example 3

A metal-clad laminate was obtained in the same manner as Example 1 except that two sheets of copper foil having a 10-μm surface resin layer and one sheet of glass cloth (IPC 1501 type, plain weave, 140 μm thick) were used and the amounts of coating resin compositions were adjusted so that the thicknesses of the core layer, the heat-curable resin layer, and the surface resin layer were 160 μm, 10 μm, and 10 μm, respectively. The thickness of the metal-clad laminate (excluding the metal layer) was 200 μm.

Example 4

A resin composition including the following materials was prepared as the resin composition of the surface resin layer:

(A) epoxy resin EPPN502H (product of Nippon Kayaku Corporation): 30 parts by mass;

(B) phenol curing agent TD-2090 (product of DIC Corporation): 20 parts by mass;

(D) 2-ethyl-4-methylimidazole (2E4MZ) (product of Shikoku Chemicals Corporation): 0.1 parts by mass, as epoxy resin curing accelerator; and (E) aluminum hydroxide "CL303" (product of Sumitomo Chemical Corporation): 20 parts by mass and spherical silica ($SiO_2$) "SO25R" (product of Admatechs Corporation) 30 parts by mass, as inorganic filler.

Then, the respective materials were measured and put into a container and methyl ethyl ketone (solvent) was added and mixed therein so that a solid content becomes 70 mass %, whereby a resin varnish was prepared.

Subsequently, a metal-clad laminate was obtained in the same manner as Example 1 except that two sheets of copper foil having a 40-μm surface resin layer and two sheets of glass cloth (IPC 1078 type, plain weave, 43 μm thick) were used and the amounts of coating resin compositions were adjusted so that the thicknesses of the core layer, the heat-curable resin layer, and the surface resin layer were 100 μm, 10 μm, and 40 μm, respectively. The thickness of the metal-clad laminate (excluding the metal layer) was 200 μm.

Example 5

A metal-clad laminate was obtained in the same manner as Example 4 except that one sheet of copper foil having a 10-μm surface resin layer and one sheet of glass cloth (IPC 1501 type, plain weave, 140 μm thick) were used and the amounts of coating resin compositions were adjusted so that the thicknesses of the core layer, the heat-curable resin layer, and the surface resin layer were 160 μm, 10 μm, and 10 μm, respectively. The thickness of the metal-clad laminate (excluding the metal layer) was 200 μm.

Comparative Example 1

Four sheets of glass cloth (IPC 1078 type, plain weave, and 43 μm thick) were stacked on copper foil and were impregnated with the same resin varnish of the resin composition of the center layer as Example 1. The copper foil was disposed on the upper surface in the same manner, and the same was put into an oven so that the resin component was cured in such a curing condition that the resin component was cured for 10 minutes at 105° C. followed by curing for 15 minutes at 200° C., whereby a copper-clad laminate was obtained.

The thicknesses of the core layer and the heat-curable resin layer of the obtained metal-clad laminate, and the metal-clad laminate (excluding the metal layer) were 190 μm, 5 μm, and 200 μm, respectively. These thicknesses were measured by observing the cross-section of the obtained metal-clad laminate using a microscope. In particular, the thickness of the heat-curable resin layer was measured by measuring the smallest distance to the copper foil from the surface of the fibrous base material in the outermost layer.

Comparative Example 2

A metal-clad laminate was obtained in the same manner as Example 1 except that two sheets of copper foil having a 10-μm surface resin layer and one sheet of glass cloth (IPC 7628 type, plain weave, 175 μm thick) were used and the amounts of coating resin compositions were adjusted so that the thicknesses of the core layer, the heat-curable resin layer, and the surface resin layer were 175 μm, 10 μm, and 3 μm, respectively. The thickness of the metal-clad laminate (excluding the metal layer) was 200 μm.

[Evaluation Method]

The copper-clad laminates (metal-clad laminates) obtained in Examples 1 to 5 and Comparative Examples were evaluated in the following manner.

[Flexural Modulus]

A flexural modulus was measured by the same method as the method of measuring the elastic modulus of the cured product of the resin composition. Specifically, the flexural modulus of the obtained copper-clad laminate was measured at 25° C. using Autograph (product of Shimadzu Corporation). The copper-clad laminate which is a measurement target was cut into segments that were 20-mm wide and 40-mm long. The measurement was performed under conditions that the point-to-point distance was 20 mm and the test speed (crosshead speed) was 0.5 mm/minute.

[Coefficient of Thermal Expansion in XY Direction]

The coefficient of thermal expansion was calculated by measuring the amount of expansion during heating using thermomechanical analysis (TMA).

[Substrate Warpage]

A substrate warpage amount was measured in such a manner that a metal-clad laminate having the size of 50-mm wide and 130-mm long was set on a flat board and the largest height of the amount of float of the four corners from the flat board was measured by a taper gauge.

[Package Warpage after Sealing]

A 50-mm wide, 130-mm long metal-clad laminate in which the copper foil was etched in advance was mold-sealed at 170° C. by a sealing material of which the glass transition temperature (by a TMA method) when cured is 140° C. and the coefficient of thermal expansion is 12 ppm/° C. (at temperatures lower than 140° C.) and 50 ppm/° C. (at 140° C. or higher), and was heated for 90 minutes at 170° C. After that, the largest height was measured by the same method as the method of measuring the substrate warpage. In this case, the thickness of the sealing material was 0.6 mm.

The evaluation results are illustrated in Table 1 together with elastic moduli, thicknesses, and the like. In the table, the thickness ratio of surface resin layer (A) (relative to entire laminate) means the ratio to the entire metal-clad laminate excluding the metal layer (metal foil).

TABLE 1

|  | Example 1 | Example 2 | Example 3 | Example 4 | Example 5 | Comparative Example 1 | Comparative Example 2 |
|---|---|---|---|---|---|---|---|
| Resin of Surface Resin Layer (A) | Epoxy | Epoxy | Epoxy | Epoxy | Epoxy | — | Epoxy |
| Coefficient of Thermal Expansion of Surface Resin Layer (A) | 30 ppm/° C. | 30 ppm/° C. | 30 ppm/° C. | 60 ppm/° C. | 60 ppm/° C. |  | 30 ppm/° C. |
| Thickness Ratio of Resin (A) (Relative To Resin (B) Thickness) | 4.0 | 2.0 | 1.0 | 4.0 | 1.0 |  | 0.30 |
| Thickness Ratio of Resin (A) (Relative To Entire Laminate) | 0.20 | 0.10 | 0.05 | 0.20 | 0.05 |  | 0.015 |
| Resin of Heat-Curable Resin Layer (B) | Heat-Curable Resin | | | | | Epoxy | |
| Thickness of Core Layer (C) | 100 μm | 140 μm | 160 μm | 100 μm | 160 μm | 200 μm | 175 μm |
| Number of Glass Cloth of Core Layer (C) | (2 ply) | (2 ply) | (1 ply) | (2 ply) | (1 ply) | (4 ply) | (1 ply) |
| Thickness of Copper Foil (D) | 12 μm | 12 μm | 12 μm | 12 μm | 12 μm | 12 μm | 12 μm |
| Flexural Modulus of CCL | 18 Gpa | 20 Gpa | 18 Gpa | 18 Gpa | 16 Gpa | 18 Gpa | 16 Gpa |
| Coefficient of Thermal Expansion of CCL In XY Direction (At 200° C. Or Lower) | 24 ppm/° C. | 24 ppm/° C. | 22 ppm/° C. | 26 ppm/° C. | 24 ppm/° C. | 20 ppm/° C. | 20 ppm/° C. |
| Substrate Warpage | 0 mm | 0 mm | 1 mm | 0 mm | 1 mm | 1 mm | 1 mm |
| Package Warpage After Sealing | 2 mm | 2 mm | 3 mm | 1 mm | 2 mm | 5 mm | 5 mm |

As can be understood from Table 1, the metal-clad laminates according to Examples 1 to 5 showed that the substrate warpage and the package warpage after sealing were reduced as compared to the metal-clad laminate of Comparative Example 1 that had not the surface resin layer and the metal-clad laminate of Comparative Example 2 in which the thickness ratio of the surface resin layer to the heat-curable resin layer was outside the range of the present invention.

Moreover, it was understood from Examples 1 to 3 that the larger the thickness ratio of the surface resin layer (relative to the heat-curable resin layer and the entire metal-clad laminate), the better the warpage can be suppressed.

Further, as in Examples 4 and 5, it was understood that when a resin composition having a high coefficient of thermal expansion was used in the surface resin layer, the warpage of the package after sealing was reduced further.

This application is based on Japanese Patent Application No. 2011-254966 filed on Nov. 22, 2011, the content of which is incorporated herein.

The present invention has been appropriately and sufficiently described hereinabove by way of embodiments by referring to the drawings in order to depict the present invention. It should be understood that a person skilled in the art can easily modify and/or improve the above embodiments. Therefore, it is to be understood that such modifications or improvements carried out by a person skilled in the art are encompassed within the scope of the claims unless the modifications or improvements depart the scope of the claims.

INDUSTRIAL APPLICABILITY

The present invention can be broadly applied in technical fields relating to a metal-clad laminate and a printed wiring board.

The invention claimed is:

1. A metal-clad laminate comprising:
an insulating layer; and
a metal layer disposed on at least one surface of the insulating layer, wherein
the insulating layer is formed by laminating at least a center layer and surface resin layers disposed on both surfaces of the center layer,
the center layer contains a heat-curable resin and includes a core layer containing at least one fibrous base material and a heat-curable resin layer that does not contain a fibrous base material,
a ratio of the thickness of the surface resin layer to the thickness of the heat-curable resin layer is between 1 and 4,
the thickness of the surface resin layer is 20 to 60 μm.

2. The metal-clad laminate according to claim 1, wherein a ratio of the thickness of the surface resin layer to the thickness of the entire metal-clad laminate excluding the metal layer is between 0.02 and 0.5.

3. The metal-clad laminate according to claim 1, wherein the surface resin layer consists of a resin composition having a coefficient of thermal expansion of 50 ppm/° C. or higher.

4. The metal-clad laminate according to claim 1, wherein the metal layer is disposed on both surfaces of the insulating layer.

5. A printed wiring board obtained by partially removing the metal layer of the metal-clad laminate according to claim 1 to form a circuit.

* * * * *